United States Patent
Wang et al.

(10) Patent No.: US 10,718,790 B2
(45) Date of Patent: *Jul. 21, 2020

(54) DEVICES FOR HIGH-DENSITY PROBING TECHNIQUES AND METHOD OF IMPLEMENTING THE SAME

(71) Applicant: Taiwan Semiconductor Manufacturing Co., Ltd., Hsin-Chu (TW)

(72) Inventors: Mill-Jer Wang, Hsinchu (TW); Ching-Nen Peng, Hsinchu (TW); Hung-Chih Lin, Hsinchu (TW); Wei-Hsun Lin, Zhubei (TW); Sen-Kuei Hsu, Kaohsiung (TW); De-Jian Liu, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/378,288

(22) Filed: Apr. 8, 2019

(65) Prior Publication Data

US 2019/0302146 A1 Oct. 3, 2019

Related U.S. Application Data

(63) Continuation of application No. 15/140,758, filed on Apr. 28, 2016, now Pat. No. 10,274,518, which is a
(Continued)

(51) Int. Cl.
*G01R 1/073* (2006.01)
*G01R 1/067* (2006.01)

(52) U.S. Cl.
CPC ..... *G01R 1/07314* (2013.01); *G01R 1/07364* (2013.01); *G01R 1/06794* (2013.01)

(58) Field of Classification Search
CPC ............ G01R 1/07314; G01R 1/07364; G01R 1/07342
See application file for complete search history.

(56) References Cited

U.S. PATENT DOCUMENTS

2002/0050832 A1* 5/2002 Aldaz ................ G01R 1/07342
324/750.25
2006/0109015 A1* 5/2006 Thacker ............... G01R 31/311
324/755.07

(Continued)

OTHER PUBLICATIONS

Probe Card, available at http://en.wikipedia.org:80/wiki/Probe_card on Jul. 23, 2010.

*Primary Examiner* — Daniel R Miller
(74) *Attorney, Agent, or Firm* — Duane Morris LLP

(57) ABSTRACT

A testing apparatus with reduced warping of the probe card and a method of reducing warping of a probe card of a testing apparatus are disclosed. The testing apparatus can include a testing head and a platform opposite the testing head, where the testing head and platform move relative to one another to bring a sample into contact with probing tips of the testing apparatus. The testing head can include a probe card printed circuit board, a stiffener, a discontinuous backer and a plurality of probing tips. The stiffener can be coupled to and reinforcing the probe card. The discontinuous backer can extend from the probe card to the stiffener, and can include at least one unfilled void extending from the stiffener to the probe card. The plurality of probing tips can extend from a distal end of the testing head.

19 Claims, 16 Drawing Sheets

Related U.S. Application Data continuation of application No. 13/865,243, filed on Apr. 18, 2013, now Pat. No. 9,354,254.

(60) Provisional application No. 61/787,716, filed on Mar. 15, 2013, provisional application No. 61/784,045, filed on Mar. 14, 2013.

(56) References Cited

U.S. PATENT DOCUMENTS

| | | |
|---|---|---|
| 2008/0079452 A1 | 4/2008 | Park |
| 2009/0146675 A1 | 6/2009 | Karklin |
| 2010/0102837 A1 | 4/2010 | Abe |
| 2013/0128474 A1 | 5/2013 | Kang |

\* cited by examiner

DEVICES FOR HIGH-DENSITY PROBING TECHNIQUES AND METHOD OF IMPLEMENTING THE SAME

CROSS-REFERENCE TO RELATED APPLICATIONS

This application is a continuation of U.S. patent application Ser. No. 15/140,758, filed Apr. 28, 2016 which is a continuation of U.S. patent application Ser. No. 13/865,243, filed Apr. 18, 2013, which claims priority to U.S. Provisional Application No. 61/784,045 filed Mar. 14, 2013, and U.S. Provisional Application No. 61/787,716 filed Mar. 15, 2013, the entireties of which are incorporated herein by reference.

TECHNICAL FIELD

The disclosure relates to devices and methods for improving test-yield for high-density probing of integrated circuits, particularly, 3-dimensional integrated circuits.

BACKGROUND

In semiconductor integrated circuit manufacturing, integrated circuits (ICs) are conventionally tested during manufacturing and prior to shipment to ensure proper operation. Wafer testing is a testing technique commonly used in production testing of wafer-mounted semiconductor ICs where a temporary electrical connection is established between automatic test equipment (ATE) and ICs formed on the wafer to demonstrate proper performance of the ICs. Components used in wafer testing include an ATE test board, a multilayer printed circuit board connected to the ATE which transfers test signals between the ATE and a probe card assembly. Conventional probe card assemblies include a printed circuit board a probe head having a plurality of flexible probing tips attached thereto. In operation, a device under test (DUT) is moved into position so the probing tip makes contact with corresponding contact points on the DUT.

Prior to testing, the probing tips are brought into contact with the DUT. It is important that each of the probing tips have sufficient electrical contact to the corresponding contact pads (or bumps) on the DUT in order to achieve accurate test result. As the number of circuits being tested increases, so do the number of probing tips required for testing and the amount of pressure required to produce the desired electrical contact between the probing tips and the DUT. However, increasing pressure has the undesired effect of warping the probe card, which prevents some probing tips from producing the desired electrical contact. Although attempts have been made to address this issue, there remains room for substantial improvement.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 9A is a top view of a grid showing locations of probing tips with inadequate electrical contact to the sample, while

FIG. 11A is a top view of a grid showing locations of probing tips with inadequate electrical contact to the sample, while

DETAILED DESCRIPTION

This disclosure provides devices and methods for producing test-yield improvements for high-density probing evaluations of integrated circuits. It is generally understood that "high-density" refers to probing evaluation devices where probe card pin counts are higher than 5000. The devices include a discontinuous backer and various reinforcement structures in order to reduce warping of the probe card assembly that supports the probing tips, which must contact the device under testing (DUT) in order to provide accurate results. Eliminating warping of the probe card assembly enables more efficient testing of the integrated circuits. A method of designing and adjusting the discontinuous backer and the reinforcing structures is also described. An overview of the method used to design and adjust the discontinuous backer and the reinforcing structures is provided in FIGS. 1 & 2. Further details of the method and structures formed according to the methods are provided in conjunction with the subsequent figures.

Figure 1:
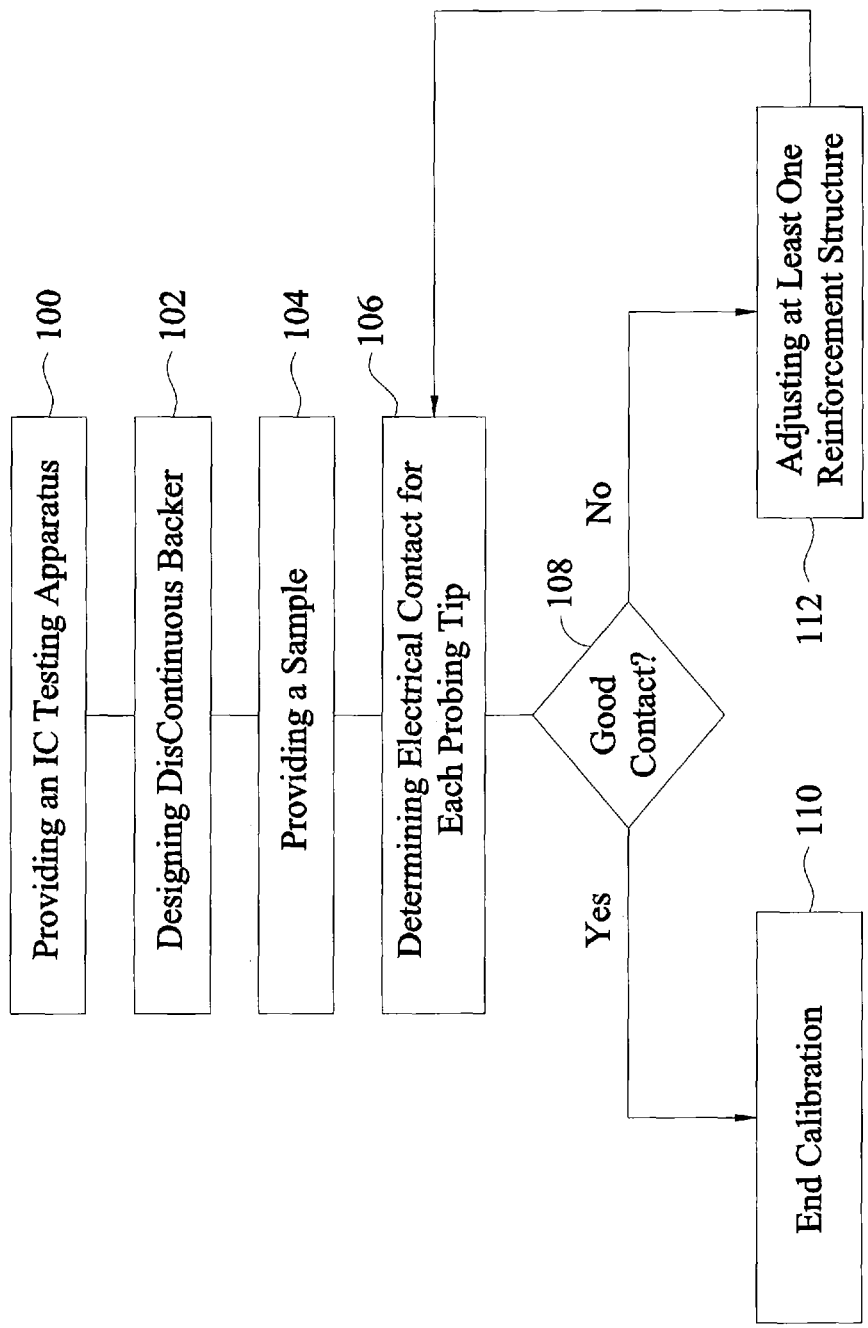
FIG. 1 is a flowchart for a method of reducing warping of a probe card printed circuit board of automatic testing equipment according to the disclosure.

In accordance with some embodiments, FIG. 1 is a flowchart describing a broad method for designing and adjusting the discontinuous backer and the reinforcing structures to improve test-yields for high-density probing technology. At step 100, an integrated circuit (IC) testing apparatus, such as an automatic test equipment (ATE), is provided. The ATE can include a probe card and a plurality of probing tips coupled to the probe card as described herein. Step 102 provides for designing a discontinuous backer. The discontinuous backer can be designed to reduce warping of the probe card, while avoiding structures, such as electrical components, on the back side of the probe card. In some embodiments, the designing phase includes co-designing the discontinuous backer and placement of the electrical components (e.g., on the probe card) to minimize warping. In some embodiments, the design can be assisted by one or more of numerical analysis, model construction and simulation. In Step 104 a sample is provided and placed on the test platform of the ATE.

Figure 5:
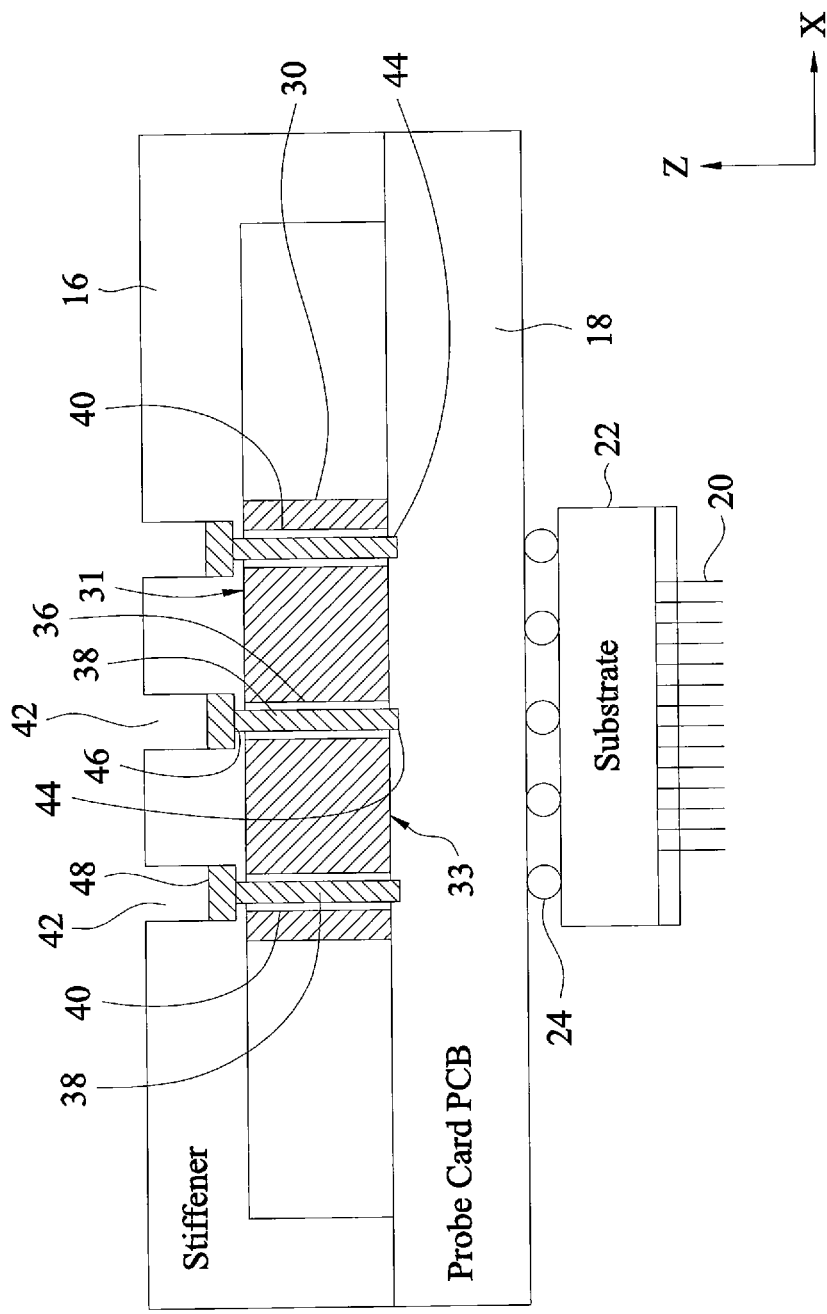
FIG. 5 is a cross-sectional view of a testing apparatus showing the relationship of the screws to other components thereof.

Step 106 provides for determining the level of electrical contact with the sample for each probing tip. The electrical contact for each probing tip can be adequate or inadequate using pre-established criteria. In some embodiments, the pre-established criteria can include optical evaluations of the sizes and/or uniformity of probe marks on pads or bumps. Step 108 assesses whether the overall level of electrical contact for all probes is sufficient for the desired testing yield. In some embodiments, if the overall level of electrical contact for all of the probing tips is sufficient, step 110 ends the calibration/design sequence. If the overall level of electrical contact for all of the probing tips in insufficient, step 112 adjusting at least one reinforcing structure to reduce warping. In some embodiments, the adjusting step 112 is repeated at least once even if the overall level of electrical contact is adequate the first time step 108 is performed. In some embodiments, the electrical contact is sufficient if the probe marks on pads or bumps are uniform, while electrical contact is insufficient if the probe marks on pads or bumps are not uniform. In some embodiments, the adjusting step 112 can include one or more of: (i) securing at least one screw through a previously unfilled void to the probe card as shown in FIG. 5, (ii) adding one or more backer units 34, and (iii) adding one or more patches 50. Following step 112, the method can continue by repeating steps 106 and 108.

Step 108 can include a comparison to any pre-established criteria for measuring whether the overall level of electrical contact for all probing tips is sufficient. In some embodiments, the pre-established criteria can be a threshold number of probing tips that meet individual criteria for good electrical contact with the sample. In some embodiments, the pre-determined criteria may require that at least 90% of the probing tips produce good electrical contact with the sample, while the threshold can be 95%, or 97.5%, or 99%, or 99.5, or even 99.9% in other embodiments. In some embodiments, electrical contact can be determined by whether the size of the probe marks on the pads or bumps is uniform (i.e., good contact) or if there are different sized probe marks (i.e., poor contact). In some embodiments, the adjusting step 112 is repeated at least once based on the results of step 106 regardless of whether the pre-determined criteria for good contact is achieved.

Figure 2:
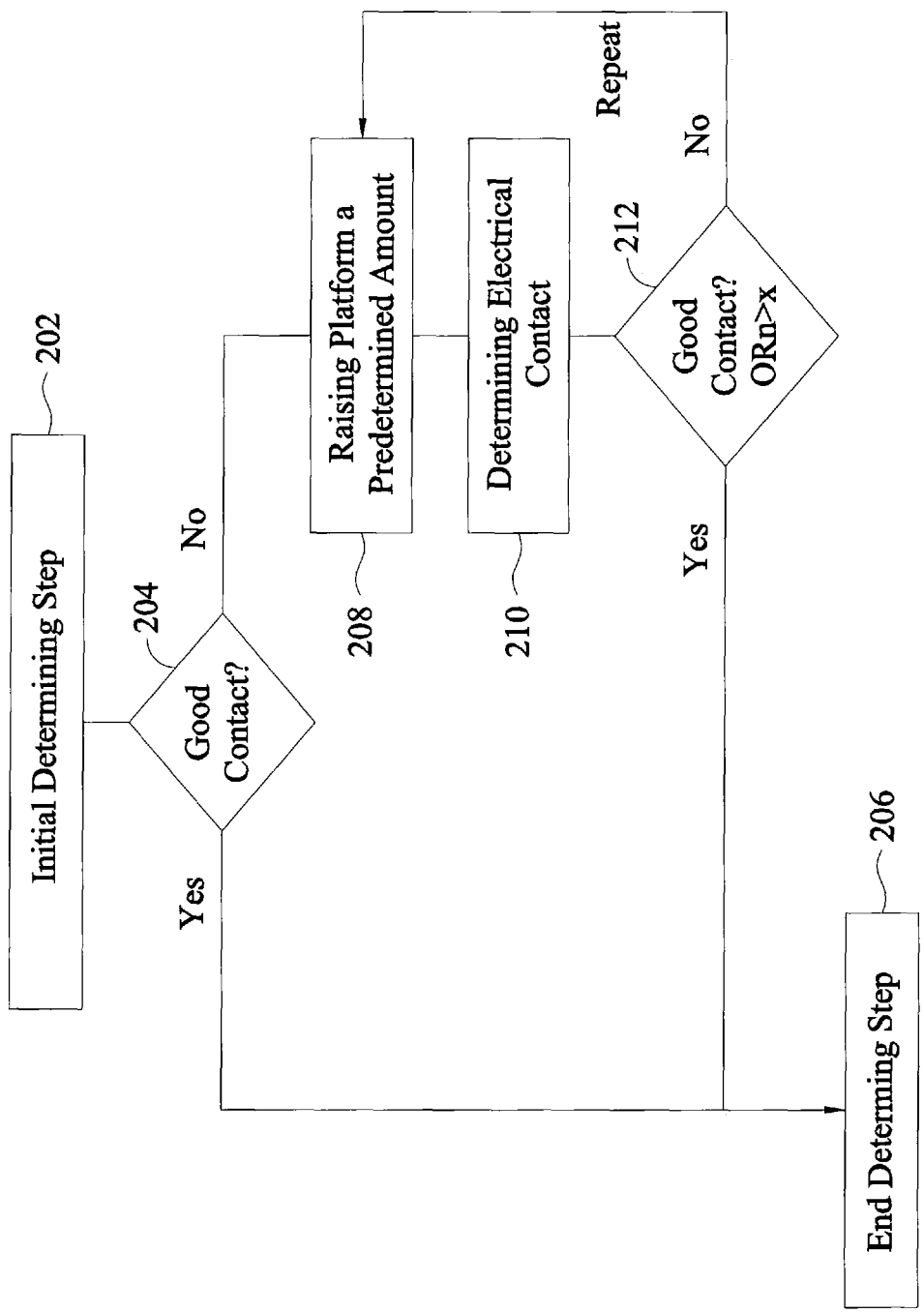
FIG. 2 is a flowchart of one embodiment of the step of determining electrical contact for each probing tip.

FIG. 2 is a flowchart describing a broad method for one embodiment of performing the determining step 106 of FIG. 1. However, some embodiments do not include the overdrive technique outlined in FIG. 2. Step 202 provides for an initial determination of the level of electrical contact between the sample and each probing tip. Step 204 provides for a determination of whether the overall level of electrical contact for all probing tips with the sample is sufficient for high-density sample testing. If sufficient contact is achieved, the determining step is discontinued 206. If insufficient contact is achieved, step 208 provides for raising the ATE platform by a pre-determined amount. In some embodiments, the pre-determined amount can range from 10 to 200 µm, or from 25 to 150 µm, or from 50 to 100 µm. Step 210 provides to determining the level of electrical contact between the sample and each probing tip. In some embodiments, the determining steps 202 and 210 can employ the same measurement techniques. Step 210 provides for a determination of whether the overall level of electrical contact for all probing tips with the sample is sufficient for high-density sample testing. If sufficient contact is achieved, the determining step 106 is discontinued 206. If insufficient contact is achieved, steps 208 and 210 are repeated.

As the platform is raised, the pressure on the probing tips and the sample increase. At some point the pressure can cause damage to the probing tips, the sample or both. Thus, in some embodiments, step 210 also includes a comparison of whether the overall movement of the platform has exceeded a pre-determined amount. If so, the determining step 106 is terminated and the method proceeds to step 108. In some embodiments, the comparison is the number of times step 208 has been performed (n). If the number of times step 208 has been performed (n) exceeds a threshold amount (x) then the determining step 106 is discontinued 206. Additional details of this process will be evident from the following discussion of FIGS. 3-10.

Figure 3:
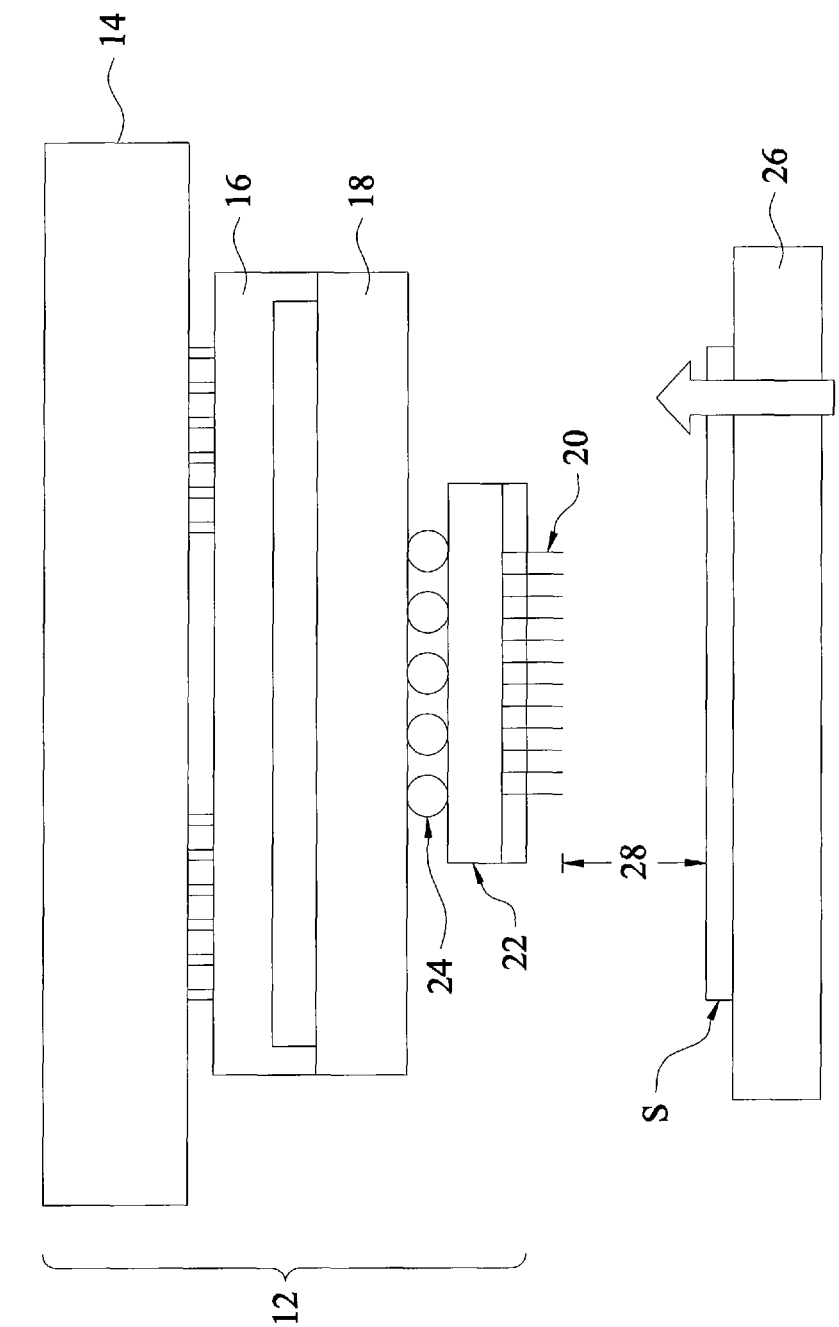
FIG. 3 is a schematic, front view of automatic testing equipment, including the testing head and the platform.

FIG. 3 is a schematic side view of an automatic test equipment (ATE) 10 arrangement. The ATE can have a testing head 12 that includes a head box 14, a stiffener 16, a probe card printed circuit board (PCB) 18, and a plurality of probing tips 20 extending down from a distal end of the testing head 12. The stiffener 16 can be coupled to and extend below the head box 14. The probe card 18 can be coupled to and extend below the stiffener 16. The plurality of probing tips 20 can be coupled to and extend below the probe card 18. The probing tips 20 can be couple to and extend below a substrate 22, which can be coupled to and extend below a plurality of bumps 24 that are coupled to and extend below the probe card 18. The probing tips 20 can extend from a distal end of the substrate 22.

The stiffener 16 can be coupled to and reinforce the probe card 18 to reduce warping. As shown in FIG. 3, in some embodiments, the stiffener 16 and the probe card 18 both include portions that are separated from one another. The ATE 10 can also include a platform 26 for supporting a sample (S) opposite the testing head 12. The testing head 12 and the platform 26 can be moved relative to one another to bring a sample (S) supported by the platform 26 into contact with at least one of the probing tips 20. In some embodiments, the gap 28 between the probing tips 20 and the platform 26 can be reduced by raising the platform 26, lowering the testing head 12, or both.

Figure 4:
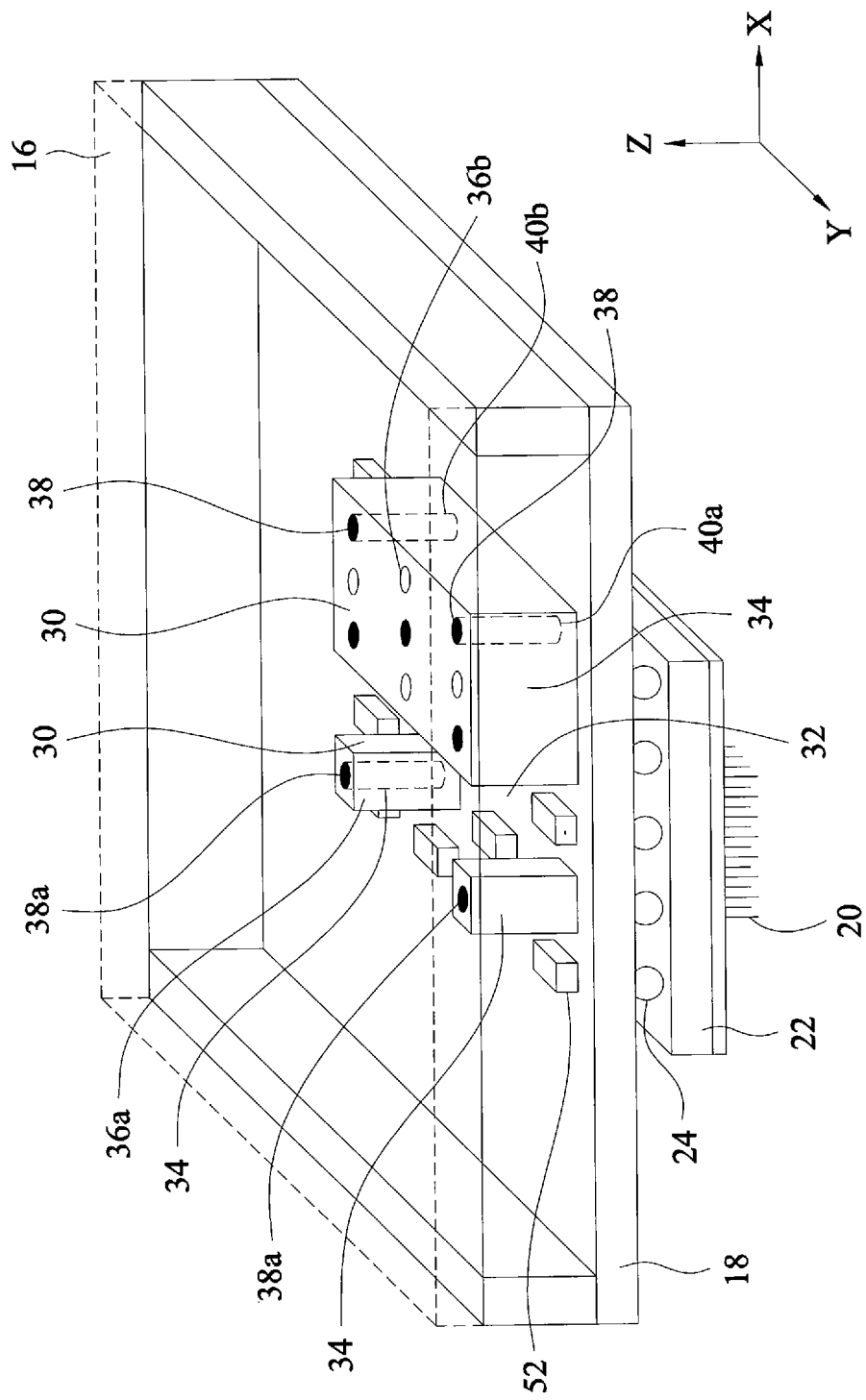
FIG. 4 is a perspective, front view of a testing apparatus showing one embodiment of the discontinuous backer according to the disclosure.

FIG. 4 shows that the testing head 12 can also include a discontinuous backer 30 extending from the probe card 18 to the stiffener 16 (shown with dotted lines for ease of illustration). The discontinuous backer 30 can include at least one unfilled void 32 extending from the stiffener 16 to the probe card 18. As shown in FIG. 4, the discontinuous backer 30 can include a plurality of discrete backer units 34, each of which extends from the probe card 18 to the stiffener 16. Each backer unit 34 comprises at least one tuning hole 36, and each backer unit 34 can be secured to the probe card 18 by a screw 38 filling a tuning hole 36. In some embodiments, electrical components 52 can be located in the unfilled voids 32.

As used herein, "voids" refers to spaces between backer units 34 or spaces within the perimeter of an individual backer unit 34 where external structures can be placed. Voids extend from a top surface 31 of the discontinuous backer 30 to the bottom surface 33 (see FIG. 5) of the discontinuous backer 30, but can also be cavities within an individual backer unit 34 that open to either the top surface 31 or the bottom surface 33 of the discontinuous backer 30. As used herein, "unfilled voids" are voids that are not completely filled in the vertical direction (z-axis). Thus, a void with a screw passing through it would not be an unfilled void, while a void with an electrical component 52 that does not extend all the way to the top of the discontinuous backer 30, as in FIG. 4, is an unfilled void 32.

As used herein, "tuning hole" refers to a hole adapted for receiving the shaft of a screw, wherein the hole either (i) intersects a line bisecting an upper surface 31 of the backer unit 34, or (ii) includes at least one other screw hole on each side thereof in a lateral or longitudinal direction (x-axis and y-axis, respectively). For example, tuning hole 36a in FIG. 4 is a tuning hole because it intersects a line bisecting an upper surface of the backer unit 34, while tuning hole 36b in FIG. 4 is a tuning hole because there is at least one other screw hole (40a and 40b) on each side of tuning hole 36b in the longitudinal direction (y-axis).

In some embodiments, such as that shown in FIG. 5, the discontinuous backer 30 includes at least one tuning hole 36 with a screw filling the tuning hole 36 and securing the discontinuous backer 30 to the probe card 18. In FIG. 5, the tuning hole 36 is between two other screw holes 40a, 40b in the lateral direction (x-axis). The screws 38 can pass through countersunk recesses 42 in the stiffener 16 and a tuning hole 36 in the discontinuous backer 30 before coupling with an internal thread hole 44 in the probe card 18. As shown in FIG. 5, an orifice 46 at the base of the countersunk recess 42 can be narrower than the screw head 48 to keep help stabilize the stiffener-backer-probe card composite structure.

Figure 6:
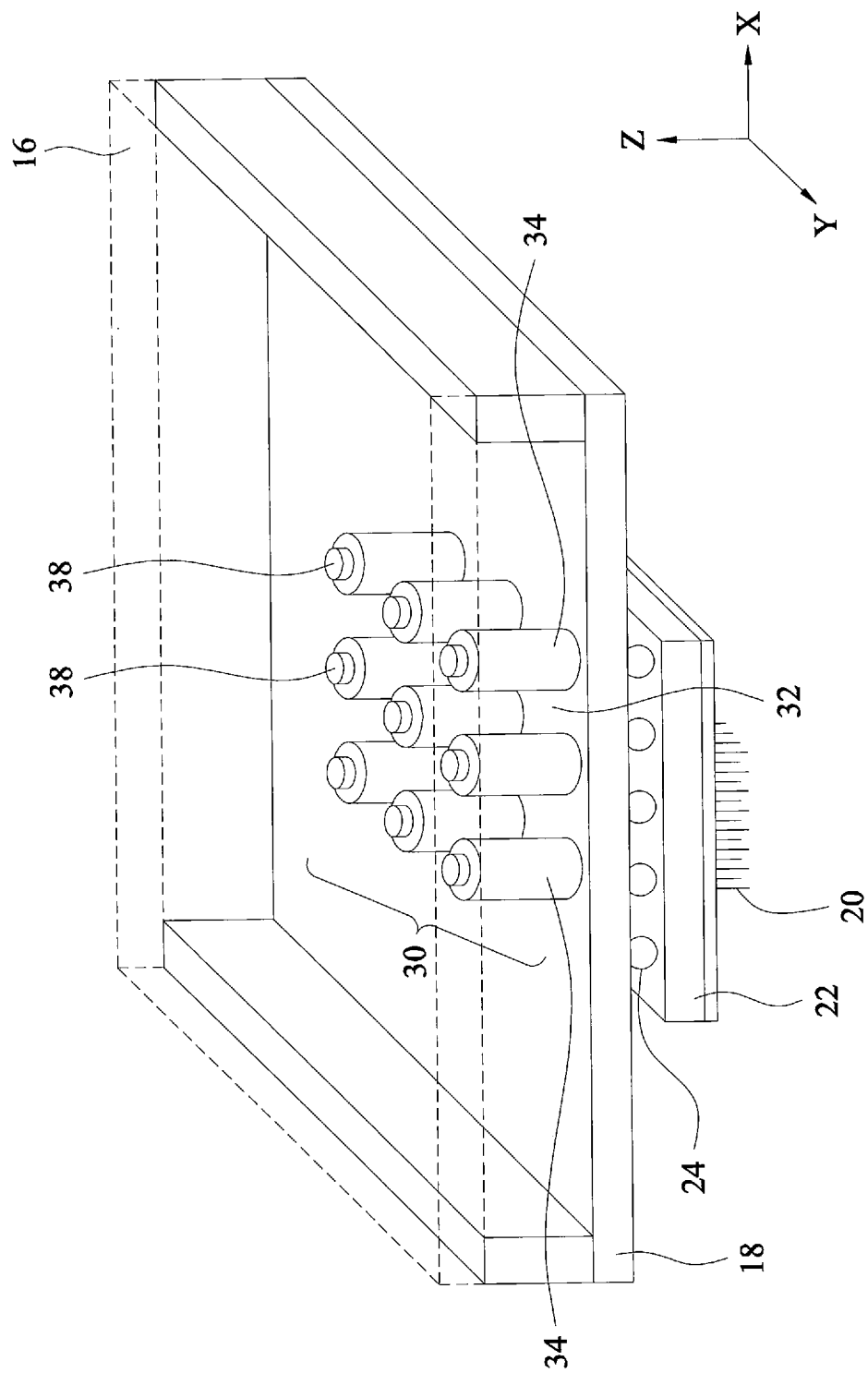
FIG. 6 is a perspective, front view of a testing apparatus showing one embodiment of the discontinuous backer according to the disclosure.

In some embodiment, the discontinuous backer 30 comprises a plurality of discrete backer units 34. As shown in FIG. 6, in such embodiments, the unfilled void(s) 32 can be interstitial space between the backer units 34. It should be noted that the screws 38 are shown as protruding in FIGS. 4 and 6 for ease of illustration; however, the screws 38 can also be countersunk as shown in FIG. 5.

Figure 7A:
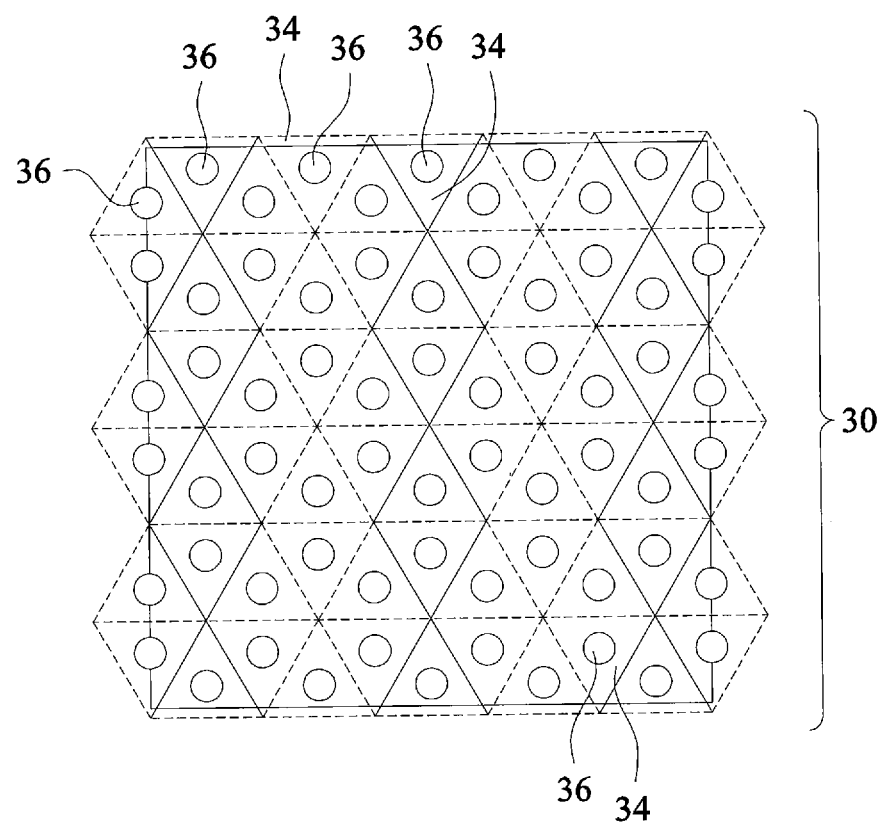
FIGS. 7A-C are top views of hole arrangements for the discontinuous backer according to the disclosure.
Figure 7B:
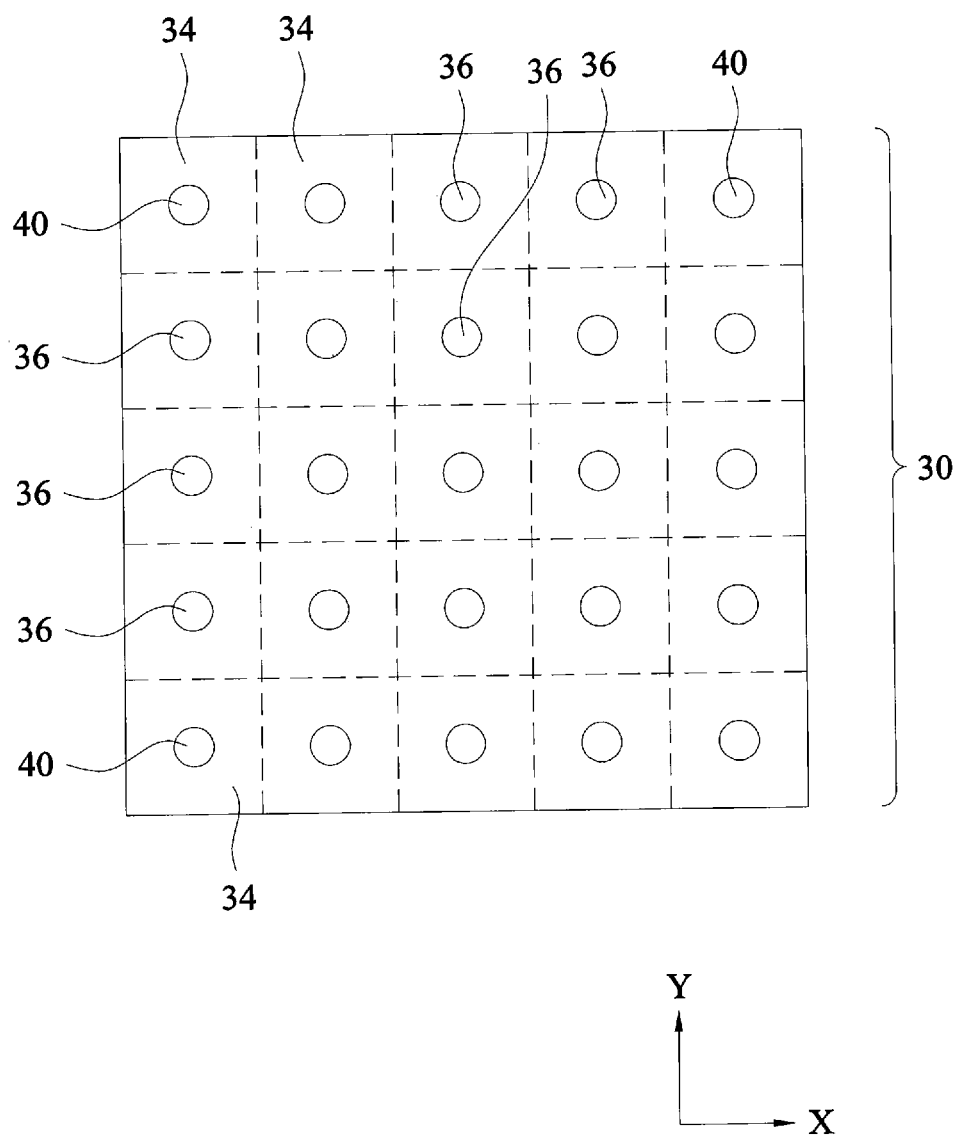
Figure 7C:
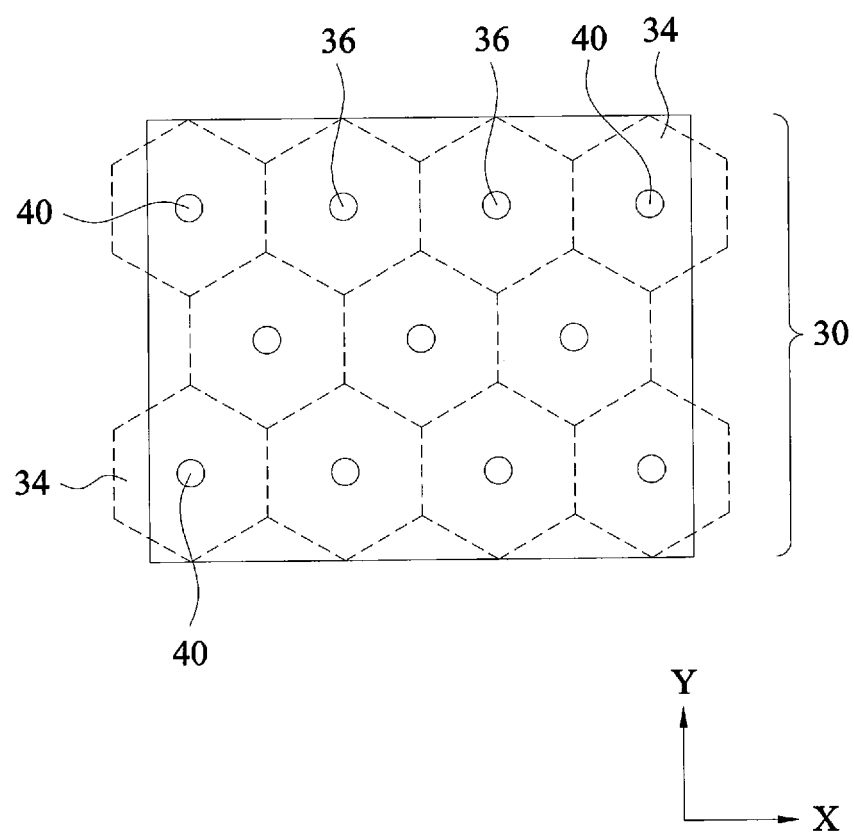

FIGS. 7A-C show several examples of patterned tuning hole 36 configurations. FIG. 7A shows a configuration where a rectangular area can include tuning holes 36 at the centers of closely packed triangles. FIG. 7B shows a configuration where a rectangular area can include tuning holes 36 at the centers of closely packed squares. Finally, FIG. 7C shows a configuration where a rectangular area can include tuning holes 36 at the centers of closely packed hexagons. Any of these hole 36, 40 arrangements can apply to (i) a plurality of discrete backer units 34, as in the cylinders of FIG. 6, (ii) patterned, discontinuous backers 30, as shown in FIGS. 8A-D, or combinations thereof. Although the corner holes 40 in FIGS. 7B and 7C are not designated as tuning screws, they would be tuning screws if the dotted lines represent a plurality of discrete backer units 34. While FIGS. 7 and 8 can both have the same density of holes 36, 40, it is worth noting that individual backer units 34 can be eliminated to create space for electrical components 52 in the embodiments of FIG. 7. In contrast, the large, discontinuous backer 30 of FIG. 8 would need to be replaced by individual backer units 34 of FIG. 7, a backer unit 30 with large unfilled voids 32, as in FIG. 12, or a combination of both in order to accommodate electrical components 52 within the area covered by the large, discontinuous backer unit 30.

Figure 8A:
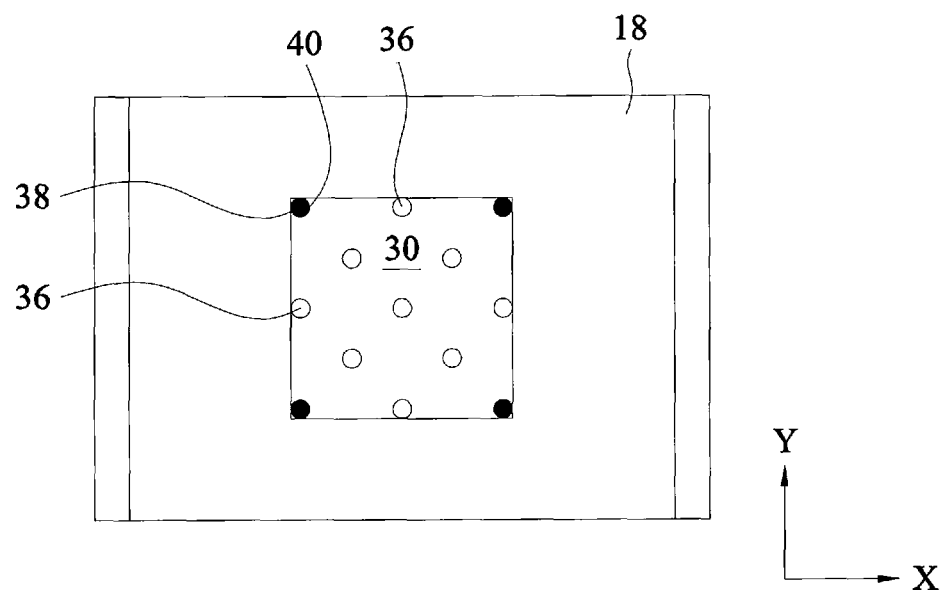
FIGS. 8A-D are top views of hole arrangements and screw placements for the discontinuous backer according to the disclosure.
Figure 8B:
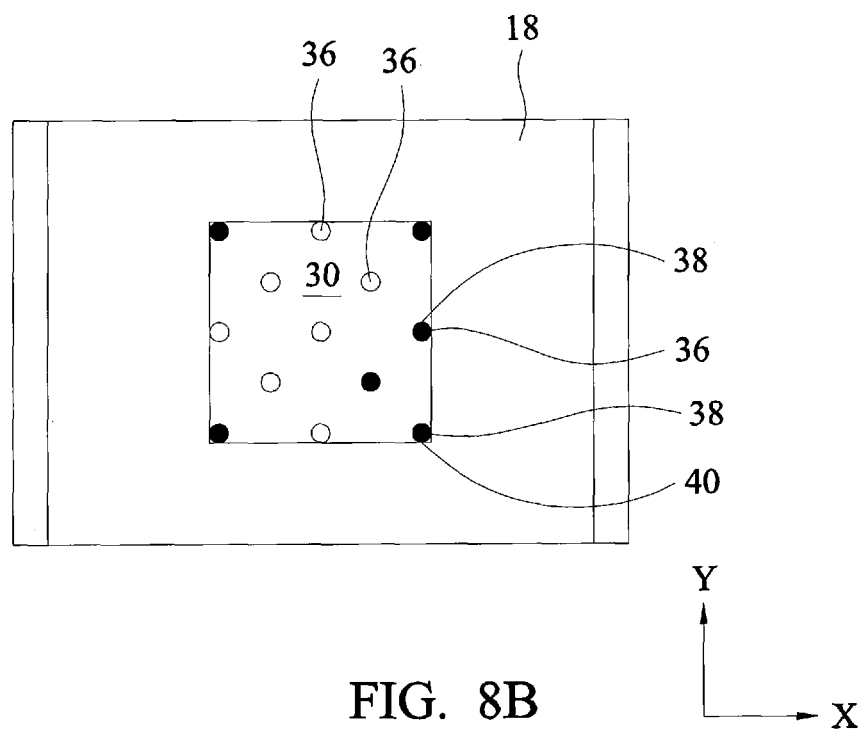
Figure 8C:
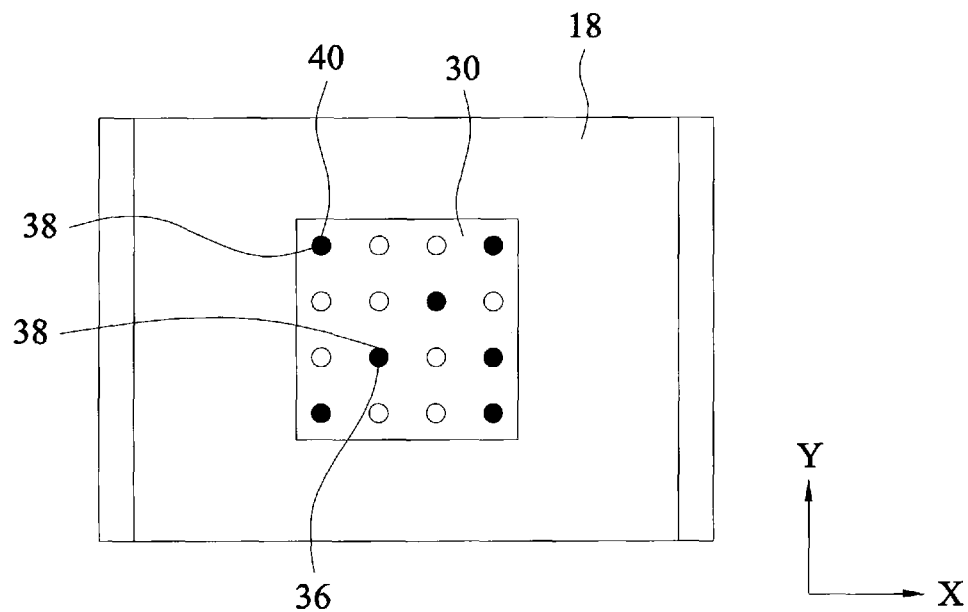
Figure 8D:
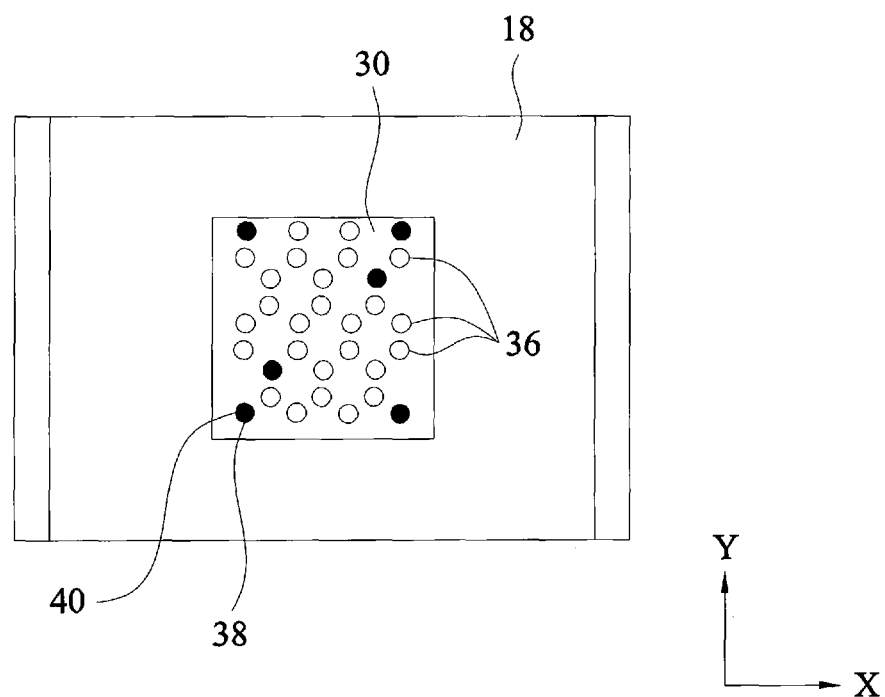

FIGS. 8A-D show patterns like those in FIGS. 7A-C, with the exception that they are part of a patterned, discontinuous backer 30. FIGS. 8A & 8B show a pattern like FIG. 7C, where the holes 36, 40 are arranges at the centers of closely packed hexagons. FIG. 8C show a pattern like FIG. 7B, where the holes 36, 40 are arranges at the centers of closely packed squares. FIG. 8D show a pattern like FIG. 7A, where the holes 36, 40 are arranges at the centers of closely packed triangles.

As shown in FIGS. 8A-D, in some embodiments, the unfilled voids can be unfilled screw holes 40, including unfilled tuning holes 36. One of the benefits, is that such an arrangement allows for the iterative calibration method described herein. For instance, if the initial determining step 106 shows that there is inadequate contact between the probing tips and the sample (S), The reinforcement structures can be adjusted (step 112) by adding or removing a reinforcement structure near the location of probing tips with failed electrical contact. As used herein, "reinforcement structures" is used to refer to screws 38, backers 30, 34 and patches 50.

Figure 9A:
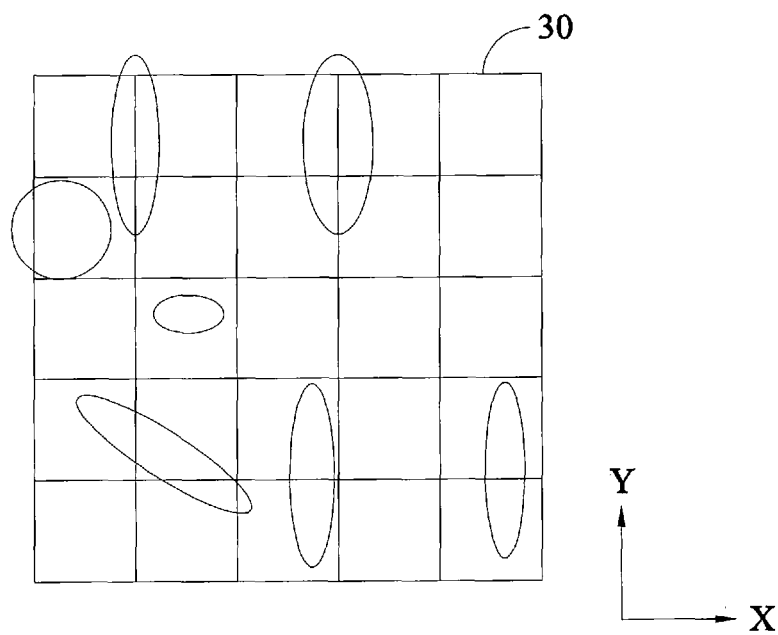
Figure 9B:
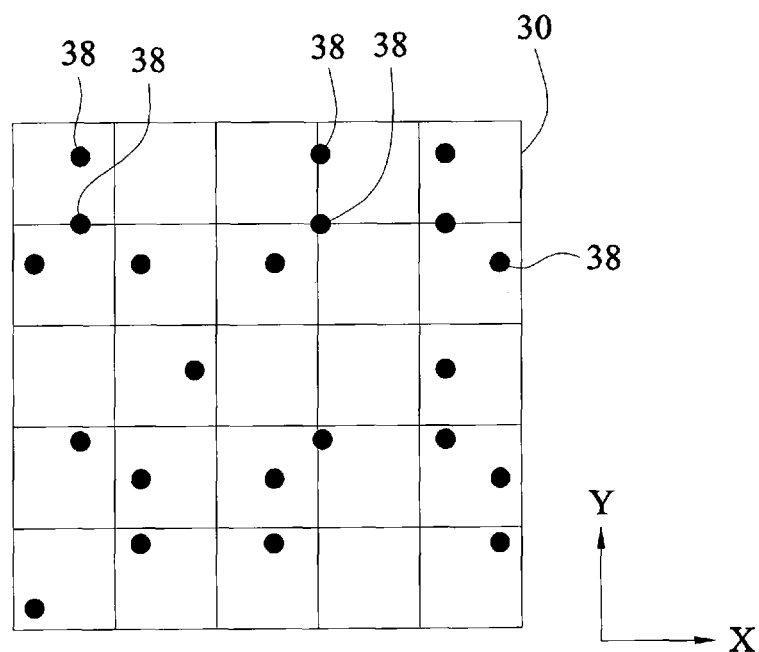
FIG. 9B is a top view of the grid according to FIG. 9A with the placement of screws to improve the electrical contact of the probing tips with inadequate electrical contact.

FIGS. 9A and 9B show an example where screws are added to a discontinuous backer 30 at positions corresponding to probe tips with failed electrical contact. FIG. 9A shows a map of the probing tips 20 where probing tips with inadequate electrical contact are circled. FIG. 9B shows a sample adjusting step where screws 38 would be added to a discontinuous backer 30 through tuning holes 36 in order to correct the warping causing the pattern of poor electrical contact shown in FIG. 9A.

Figure 10A:
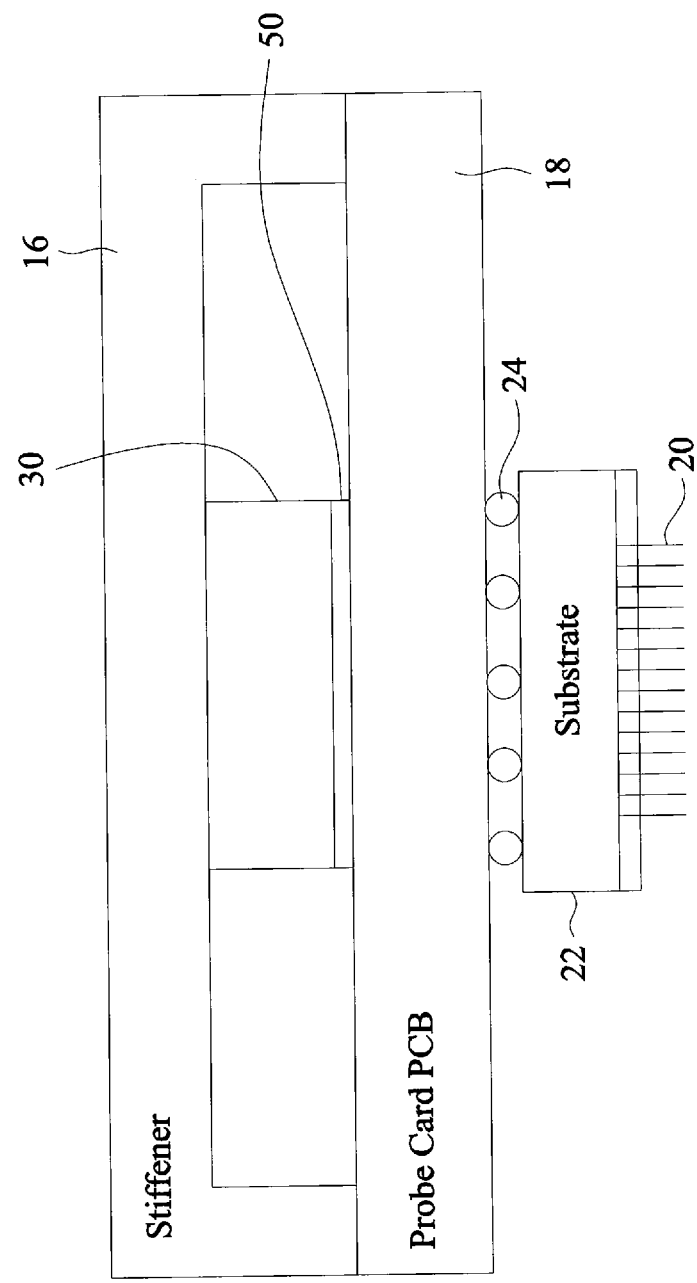
FIGS. 10A-B are a side view and perspective view, respectively, showing different arrangements of patches according to the disclosure
Figure 10B:
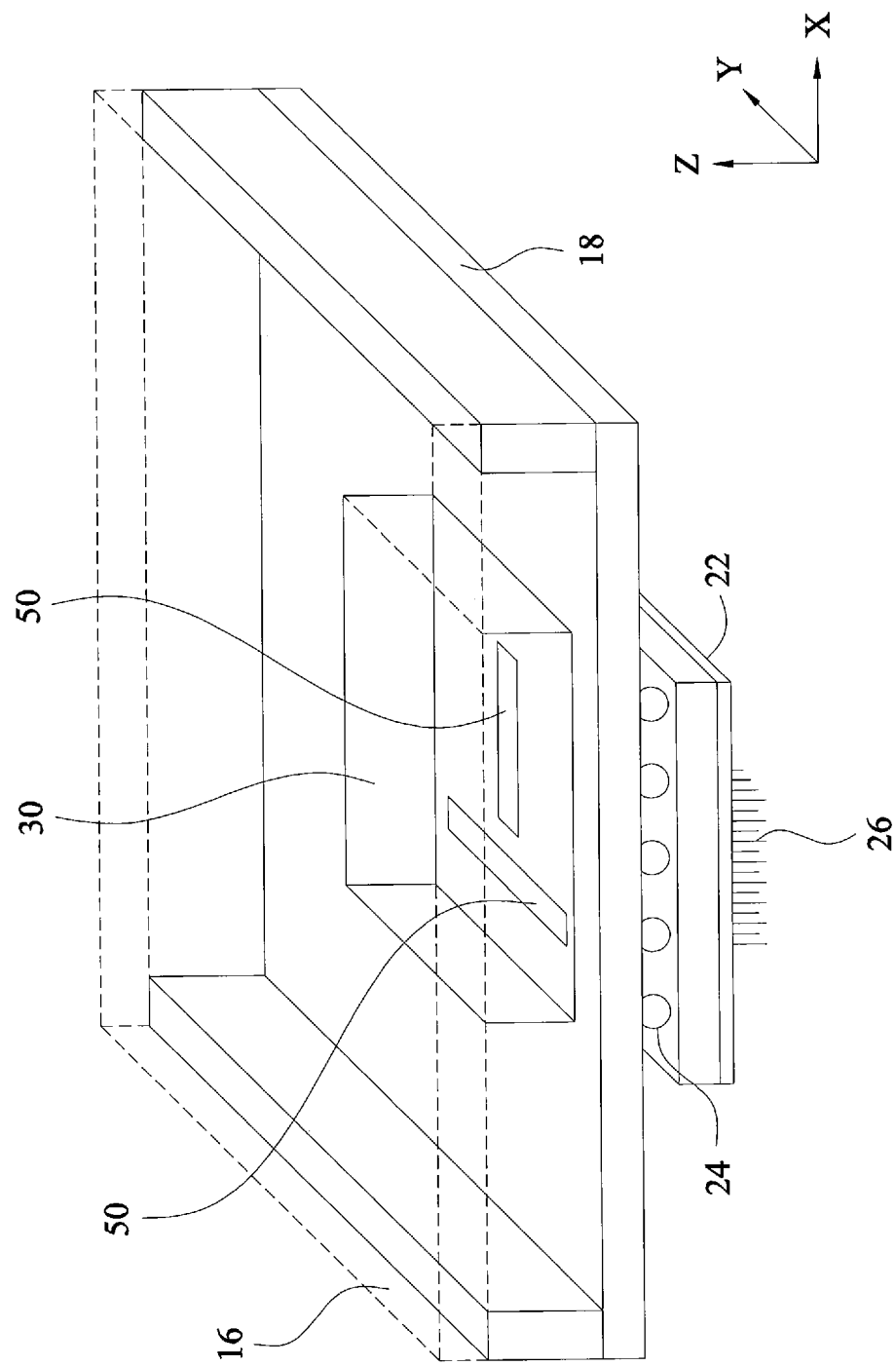

Another technique used in some embodiments for reducing warping is using a patch 50. As shown in FIGS. 10A-B, (i) at least one patch 50 can be placed between the probe card 18 and the discontinuous backer 30. Similarly, at least one patch 50 can be placed between the stiffener 16 and the discontinuous backer 30. In some embodiments, the initial adjustments can be made using screws 38 and fine tuning (i.e., subsequent adjustment steps) can be achieved using one or more patches 50. In one embodiment, the a patch can be a biaxially-oriented polyethylene terephthalate (BoPET), such as that sold under the trade name MYLAR by DuPont, or the patch 50 can be any suitable material in other embodiments. The patch material can have a thickness ranging from 0.001 mm to 0.5 mm, or from 0.01 mm to 0.2 mm or from 0.02 mm to 1 mm.

In some embodiments, the patches 50 can be applied as a single piece under the entire discontinuous backer 30 as suggested by the side view of FIG. 10A. In other embodiments, such as the perspective view of FIG. 10B, the patches can extend less than a longitudinal dimension, a lateral dimension, or both of the backer unit 34.

Figure 11A:
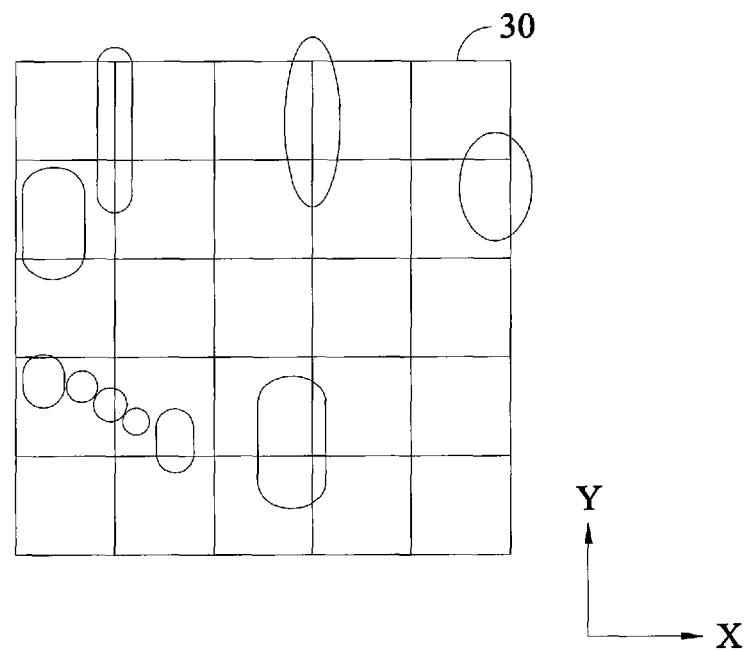
Figure 11B:
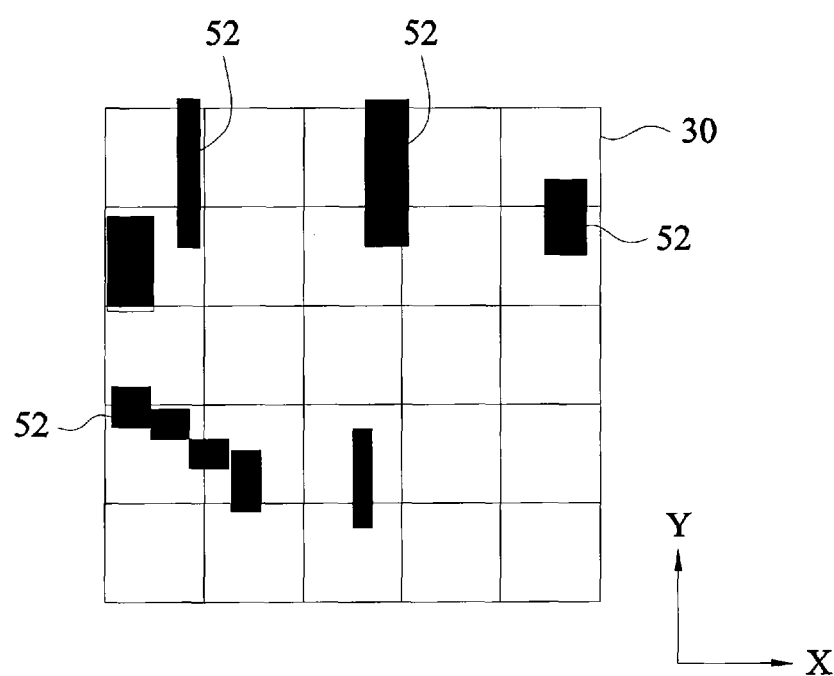
FIG. 11B is a top view of the grid according to FIG. 11A with the placement of patches to improve the electrical contact of the probing tips with inadequate electrical contact.

FIGS. 11A and 11B show an example where patches 50 were added between a discontinuous backer 30 and a probe card 18 at positions corresponding to probe tips with failed electrical contact. FIG. 11A shows a map of the probing tips 20 where probing tips with inadequate electrical contact are circled. FIG. 11B shows an example adjustment step 112 where patches 50 would be added beneath the discontinuous backer 30 in order to correct the warping causing the pattern of poor electrical contact shown in FIG. 11A. The patches 50 can be combined with any of the backer 30 configurations shown herein (e.g., FIGS. 4-12).

Figure 12A:
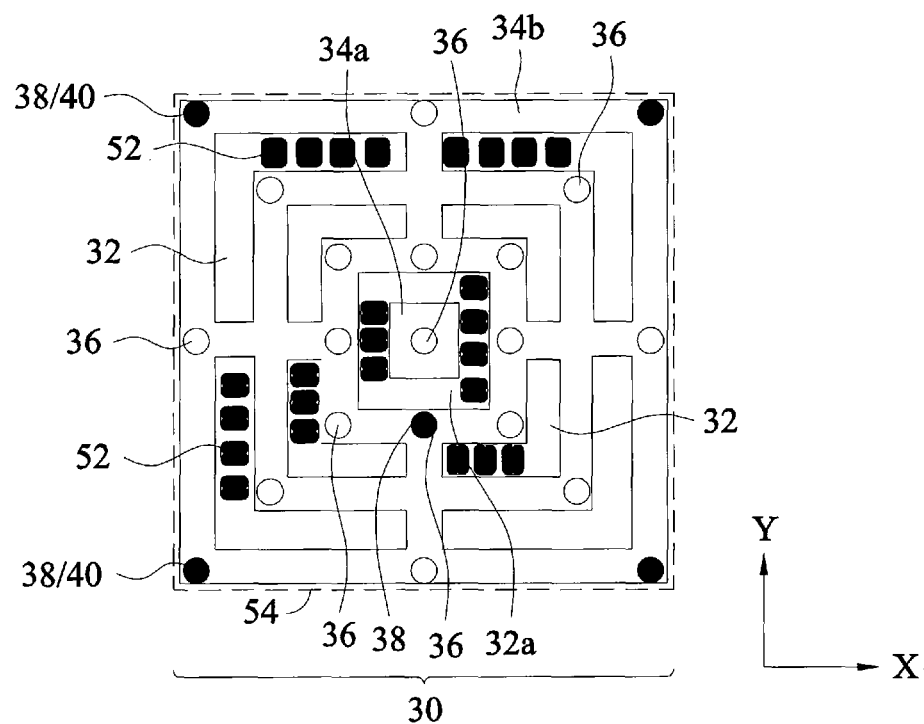
FIGS. 12A-B are top views of different discontinuous backer configurations according to the disclosure.
Figure 12B:
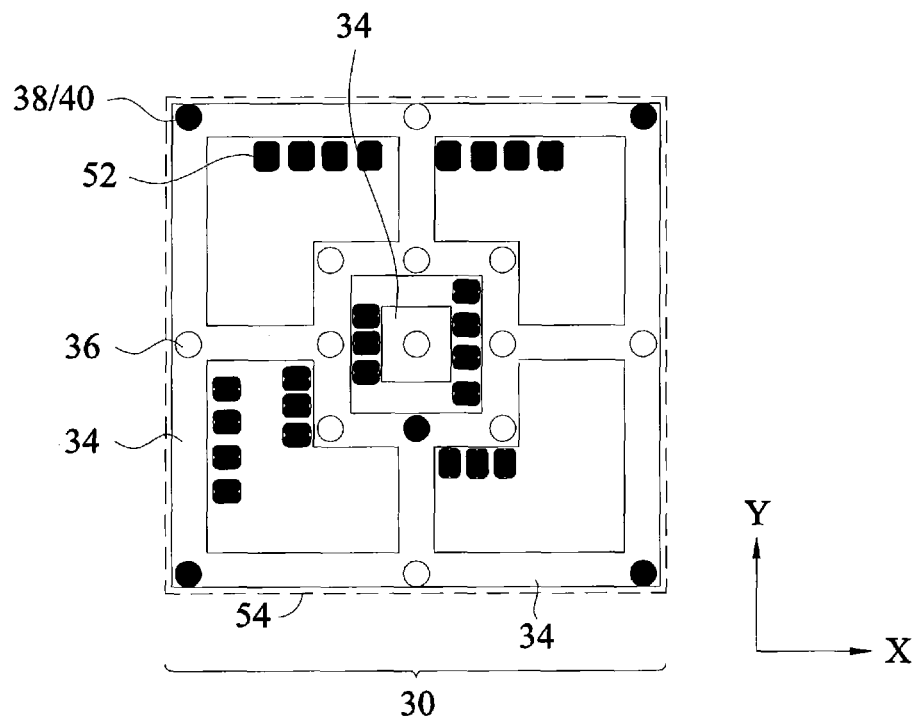

FIGS. 12A & B show a top view of an embodiment where a discontinuous backer 30 includes multiple unfilled voids 32 within the outer perimeter 54 of an individual backer unit 34. In some embodiments, such as those in FIGS. 12A & B the testing head 12 can include electrical components 52 coupled to a backside of the probe card 18, where the electrical components 52 are positioned within the at least one unfilled void 32 of the individual backer unit 34. In some embodiments, step 102 can include designing the individual backer unit 34 to accommodate the electrical components 52 within the unfilled void(s) 32. As shown in FIGS. 12A & B, a discrete backer unit 34a can be located in an unfilled void within the outer perimeter 54 of a second backer unit 34b to produce an unfilled void 32a between the two backer units. In instances where warping issues are particularly difficult and electrical components 52 are present, the interconnected backers 30 with unfilled voids 32 adapted to accommodate electrical components 52 within their outer perimeters 54 (such as those shown in FIG. 12) can be particularly useful.

In some embodiments, a designer can attempt to correct warping using a combination of discrete backer units 34, such as shown in FIGS. 6 & 7. The designer can also adopt a mixed strategy of single or twin holed discrete backer units 34 and larger backer units 34 as in FIG. 4. In some situations, where warping remains a problem with the approaches of FIGS. 4, 6 & 7, it can be beneficial for the designer to implement the backer 30 design of FIG. 12, which includes unfilled voids 32 adapted to receive electrical components 52 within the outer perimeter 54 of the backer 30. Yet another strategy for addressing warping is to redesign the probe card 18 to eliminate the electrical components 52. In some embodiments, the method can include attempting the embodiment shown in FIG. 4, FIGS. 6 & 7 or both first, then trying eliminating electrical components 52, followed by implementing the approach of FIG. 12. On other embodiments, the approach of FIG. 12 and eliminating the electrical components 52 can be reversed. All approaches can also include the use of patches 50, as shown in FIGS. 10 & 11.

Some of the embodiments of the present disclosure include a testing head. The testing head can include a probe card printed circuit board, a stiffener, a discontinuous backer and a plurality of probing tips. The stiffener can be coupled to and reinforcing the probe card, and the probe card and the stiffener can each include portions that are separated from one another. The discontinuous backer can extend from the probe card to the stiffener, and can include at least one unfilled void extending from the stiffener to the probe card. The plurality of probing tips can extend from a distal end of the testing head.

In some embodiments, the testing apparatus also includes at least one tuning hole in the discontinuous backer, and a screw the fills the tuning hole and secures the discontinuous backer to the probe card.

In some embodiments, the discontinuous backer includes a plurality of discrete backer units, where each backer unit comprises at least one tuning hole, and where each backer unit is secured to the probe card by a screw filling each tuning hole.

In some embodiments, the testing apparatus also includes (i) at least one patch between the probe card and the discontinuous backer, (ii) at least one patch between the stiffener and the discontinuous backer, or (iii) both.

In some embodiments, the discontinuous backer comprises a plurality of discrete backer units, and the at least one unfilled void comprises interstitial space between the backer units.

In some embodiments, the at least one unfilled void comprises unfilled screw holes.

In some embodiments, the testing apparatus also includes electrical components coupled to a backside of the probe card, wherein the electrical components are positioned within the at least one unfilled void.

In some embodiments, the at least one unfilled void is located within the outer perimeter of an individual backer unit.

In some embodiments, the discontinuous backer comprises at least one unfilled tuning hole.

In another broad form of the present disclosure, another testing apparatus is described. The testing apparatus including a testing head and a platform opposite the testing head, wherein the testing head and the platform can be moved relative to one another to bring a sample supported by the platform into contact with probing tips of the testing apparatus. The testing head can include a probe card printed circuit board, a stiffener, a discontinuous backer at least one patch, and a plurality of probing tips. The stiffener can be coupled to and reinforcing the probe card, and the probe card and the stiffener can each include portions that are separated from one another. The discontinuous backer can extend from the probe card to the stiffener, and can include at least one unfilled void extending from the stiffener to the probe card. The at least one patch can be (i) positioned between the probe card and the discontinuous backer, or (ii) positioned between the stiffener and the discontinuous backer. The plurality of probing tips can extend from a distal end of the testing head. The at least one unfilled void can be located within the outer perimeter of an individual backer unit.

In yet another broad form of the present disclosure a method for reducing warping of a probe card printed circuit board of a testing apparatus is provided. The method can include (a) providing an integrated circuit testing apparatus (b) providing a test sample; (c) determining whether there is adequate electrical contact between each probing tip and the test sample; and (d) adjusting at least one reinforcement structure based on a location of probing tips with failed electrical contact. The testing apparatus can include a testing head and a platform opposite the testing head, wherein the testing head and the platform can be moved relative to one another to bring a sample supported by the platform into contact with probing tips of the testing apparatus. The testing head can include a probe card printed circuit board, a stiffener, a discontinuous backer and a plurality of probing tips. The stiffener can be coupled to and reinforcing the probe card, and the probe card and the stiffener can each include portions that are separated from one another. The discontinuous backer can extend from the probe card to the stiffener, and can include at least one unfilled void extending from the stiffener to the probe card. The plurality of probing tips can extend from a distal end of the testing head.

In some embodiment, the adjusting step includes securing at least one screw passing through at least one of the previously unfilled voids to the probe card.

In some embodiment, the adjusting step comprises adding one or more backers.

In some embodiment, the adjusting step comprises adding at least one patch, wherein (i) at least one patch is positioned between the probe card and the discontinuous backer, (ii) at least one patch is positioned between the stiffener and the discontinuous backer, or (iii) both.

In some embodiment, the adjusting step comprises adding reinforcement structures at positions corresponding to probing tips with failed electrical contact.

In some embodiment, the determining step comprises:
(c1) an initial determining step to assess whether there is adequate electrical contact between each probing tip and the test sample;
(c2) if adequate electrical contact of the probing tips is not achieved, the determining step further comprises:
raising the platform by a predetermined amount, and determining whether there is adequate electrical contact between each probing tip and the test sample; and (c3) repeating step (c2) at least once if there are a threshold number of probing tips with failed electrical contacts.

In some embodiments, the method includes repeating steps (c) and (d) until adequate electrical contact of the probing tips is achieved In some embodiments, the testing head comprises electrical components coupled to a backside of the probe card, and the at least one backer is designed and positioned such that the electrical components are positioned within or between the discontinuous backer.

In some embodiments, the at least one unfilled void is located within the outer perimeter of a backer unit of the discontinuous backer and an electrical component is positioned within the unfilled void.

In some embodiments, prior to step (b), the method further includes, designing a discontinuous backer designed to accommodate at least one electrical component within the at least one unfilled void.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is set to be understood in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A testing head comprising:
a probe card printed circuit board,
a stiffener coupled to and reinforcing the probe card printed circuit board, wherein the stiffener extends from a first end of the probe card printed circuit board to an opposite end of the probe card printed circuit board,
a plurality of individual discrete backer units extending from the probe card printed circuit board to the stiffener, wherein each of the individual discrete backer units comprises at least one tuning hole and is formed separately from the probe card printed circuit board, and
a plurality of probing tips extending from a distal end of the testing head, wherein the plurality of probing tips are attached vertically below the plurality of individual discrete backer units and the at least one tuning hole is configured to receive a screw therein to adjust a distance between the probe card printed circuit board and the stiffener at positions corresponding to probe tips with failed electrical contact.

2. The testing head as in claim 1, wherein the plurality of individual discrete backer units each comprise at least one tuning hole configured to be filled by a screw.

3. The testing head as in claim 2, wherein at least one unfilled void is located between outer perimeters of different individual discrete backer units.

4. The testing head as in claim 3, further comprising electrical components coupled to a backside of the probe card printed circuit board, wherein the electrical components are positioned within the at least one unfilled void.

5. The testing head as in claim 1, further comprising (i) at least one patch between the probe card printed circuit board and the individual discrete backer units, (ii) at least one patch between the stiffener and the individual discrete backer units, or (iii) both.

6. The testing head as in claim 1, wherein each individual discrete backer unit is secured to the probe card printed circuit board by a screw filling at least some of the tuning holes.

7. The testing head of claim 1, further comprising:
at least one patch, wherein (i) the at least one patch is positioned between the probe card printed circuit board and the individual discrete backer units, (ii) the at least one patch is positioned between the stiffener and the individual discrete backer units, or (iii) both,
wherein a platform is opposite the testing head, and the testing head and the platform can be moved relative to one another to bring a sample supported by the platform into contact with at least one of the probing tips.

8. The testing head of claim 1, wherein the probe card printed circuit board has an area divided into a plurality of abutting hexagons, and each of the individual discrete backer units is located at a respective center of a respective one of the abutting hexagons.

9. The testing head of claim 1, wherein the probe card printed circuit board has an area divided into a plurality of abutting triangles, and each of the individual discrete backer units is located at a respective center of a respective one of the abutting triangles.

10. The testing head of claim 1, wherein the probe card printed circuit board has an area divided into a plurality of abutting squares, and each of the individual discrete backer units is located at a respective center of a respective one of the abutting squares.

11. A method, comprising:
(a) contacting a sample using a testing head comprising a printed circuit board (PCB) and a plurality of probing tips coupled to the PCB;
(b) determining whether there is adequate electrical contact between each individual one of the plurality of probing tips and the sample;
(c) adding one or more backers to the PCB,
   wherein each backer extends from the PCB to a stiffener that is coupled to the PCB and comprises at least one tuning hole, and wherein each backer is formed separately from the stiffener; and
(d) adjusting a distance between the probe card printed circuit board and the stiffener by adding a screw in the least one tuning hole at positions corresponding to probe tips with failed electrical contact.

12. The method as in claim 11, wherein each backer comprises at least one void extending from the stiffener to the PCB, at least one of the backers having an unfilled void, and step (c) comprises securing at least one screw passing through at least one previously unfilled void to the PCB.

13. The method of claim 12, wherein securing the at least one screw includes passing the at least one screw through an opening in the stiffener, the opening adjacent to the at least one previously unfilled void.

14. A method, comprising:
(a) contacting a sample using a testing head, comprising:
   a probe card printed circuit board,
   a stiffener coupled to and reinforcing the probe card printed circuit board,
   a discrete backer extending from the probe card printed circuit board to the stiffener, the discrete backer formed separately from the stiffener, and
   a plurality of probing tips extending from a distal end of the testing head; and
(b) determining whether there is adequate electrical contact between each individual one of the plurality of probing tips and the sample
(c) adding at least one patch, wherein (i) the at least one patch is positioned between the probe card printed circuit board and the discrete backer, (ii) the at least one patch is positioned between the stiffener and the discrete backer, or (iii) both.

15. The method as in claim 14, further comprising adding reinforcement structures at positions corresponding to probing tips with failed electrical contact.

16. The method as in claim 14, wherein the determining step comprises:
(b1) an initial determining step to assess whether there is adequate electrical contact between each probing tip and a test sample;
(b2) if adequate electrical contact of the probing tips is not achieved, the determining step further comprises:
   raising a platform supporting the sample by a predetermined amount, and determining whether there is adequate electrical contact between each probing tip and the sample; and
(b3) repeating step (b2) at least once if there are a threshold number of probing tips with failed electrical contacts.

17. The method as in claim 14, further comprising repeating steps (b) and (c) until adequate electrical contact of the probing tips is achieved.

18. The method as in claim 14, wherein the testing head further comprises electrical components coupled to a backside of the probe card printed circuit board, and the discrete backer is positioned such that the electrical components are positioned within or between portions of the discrete backer.

19. The method as in claim 14, wherein prior to step (b), the method further comprises, designing the discrete backer to accommodate at least one electrical component within at least one unfilled void.

* * * * *